United States Patent [19]
deSouza et al.

[11] Patent Number: 5,188,978
[45] Date of Patent: Feb. 23, 1993

[54] CONTROLLED SILICON DOPING OF III-V COMPOUNDS BY THERMAL OXIDATION OF SILICON CAPPING LAYER

[75] Inventors: Joel deSouza, Yorktown Heights; James H. Greiner, Millwood; Devendra K. Sadana, Pleasantville, all of N.Y.

[73] Assignee: International Business Machines Corporation, Armonk, N.Y.

[21] Appl. No.: 754,276

[22] Filed: Aug. 30, 1991

Related U.S. Application Data

[63] Continuation of Ser. No. 487,501, Mar. 2, 1990, abandoned.

[51] Int. Cl.$^5$ ............................................. H01L 21/225
[52] U.S. Cl. ..................................... 437/160; 437/162; 437/247; 437/912; 437/987
[58] Field of Search ............... 437/160, 162, 247, 912, 437/987

[56] References Cited

U.S. PATENT DOCUMENTS

| | | | |
|---|---|---|---|
| 3,484,854 | 12/1969 | Wolley | 437/989 |
| 3,530,015 | 9/1970 | Antell | 437/987 |
| 4,063,967 | 12/1977 | Graul | 437/162 |
| 4,426,765 | 1/1984 | Shahriary et al. | |
| 4,615,766 | 10/1986 | Jackson et al. | |
| 4,634,474 | 1/1987 | Camlibel et al. | |
| 4,714,518 | 12/1987 | Satyanarayan et al. | |
| 4,757,369 | 7/1988 | Jackson et al. | |
| 4,784,975 | 11/1988 | Hofmann et al. | |
| 4,830,983 | 5/1989 | Thornton | |

FOREIGN PATENT DOCUMENTS 58-103122 6/1983 Japan.
42163 2/1986 Japan.

OTHER PUBLICATIONS

Greiner, M. E., et al. "Diffusion of Silicon in Gallium Arsenide Using Rapid Thermal Processing: Experiment and Model," Applied Physics Letters, 44(8): 750 (1984).

Zou, W. X. et al., "Self-Aligned Si-Zn Diffusion into GaAs and AlGaAs," Journal of *Applied Physics* 64(4): 1855 (1988).

Fountain, G. G. et al., "GaAs MIS Structures with $SiO_2$ Using a Thin Silicon Interlayer," *Electronics Letters*, vol. 24, No. 18 p. 1134 (1988).

Asano, Tanemasa et al., "A New Thermostable Ohmic Contact to n-GaAs-n+-si/n-GaAs Structure," *Extended Abstracts of the 19th Conference on Solid State Devices and Materials, Tokyo*, pp. 67-70 (1987).

Tiwari, Sandip et al., "Unpinned GaAs MOS Capacitors and Transistors," *IEEE Electron Device Letters*, vol. 9, No. 9, p. 488 (1988).

Primary Examiner—Brian E. Hearn
Assistant Examiner—Linda J. Fleck
Attorney, Agent, or Firm—Scully, Scott, Murphy & Presser

[57] ABSTRACT

The method for silicon doping of III-V compounds by depositing a layer of silicon on the surface of a III-V compound substrate and subjecting the silicon capped substrate to thermal oxidation at temperatures and in an oxidizing atmosphere sufficient to cause silicon to diffuse into the substrate. A subsequent annealing step enhances the electrical characteristics of the diffused region.

43 Claims, 8 Drawing Sheets

CONTROLLED SILICON DOPING OF III-V COMPOUNDS BY THERMAL OXIDATION OF SILICON CAPPING LAYER

This application is a continuation of application Ser. No. 487,501, filed on Mar. 2, 1990, abandoned.

BACKGROUND OF THE INVENTION

1. Field of the Invention

The present invention relates to doping of semiconductor III-V compounds with silicon and more particularly, to a method of silicon diffusion by thermal oxidation of a silicon capping layer.

2. Description of the Prior Art

In the fabrication of devices made from III-V compounds, such as gallium arsenide, doping is accomplished by ion implantation of the dopant elements. The control of the doping profiles in the layers of semiconductor material to obtain shallow junctions is generally achieved by implanting the dopants, such as silicon, to a predetermined depth as required to provide the desired electrical characteristics to the device. Subsequent to the step of ion implantation, it is necessary to anneal the semiconductor material to remove the damage caused by the implanted ions. Nevertheless, the damage that was produced by the ion implantation sets a limit on the electrical activation and carrier mobility in the III-V compounds. In addition, the activation efficiency typically degrades with an increasing dose of the implanted ions.

The diffusion of silicon into the III-V compounds has attracted attention as an alternative to ion implantation. Greiner et al. Appl. Phys. Lett. 44(8) 1984 disclose a method for diffusing silicon in gallium arsenide by using rapid thermal processing. The process includes depositing a layer of silicon by electron beam evaporation and subsequently depositing a layer of silicon dioxide by plasma enhanced chemical vapor deposition. Diffusion was accomplished by subsequently annealing the oxide capped silicon in a rapid thermal annealer, resulting in sheet resistances as low as 50 ohms per square and a maximum electron concentration of $5-6 \times 10^{18}$ $cm^{-3}$. No measurable diffusion was obtained by annealing uncapped layers of silicon. The use of the two different processes for depositing the silicon and for depositing the silicon dioxide cap layer presents manufacturing difficulties and may cause deficiencies in device characteristics.

SUMMARY OF THE INVENTION

The present invention is directed to a method for silicon doping of III-V semiconductor compounds by thermal oxidation of a layer of silicon deposited on the III-V material. The oxidation of the silicon capped III-V substrate causes silicon to diffuse into the underlying III-V material and at the same time causes Ga and possibly also As to diffuse out of the substrate. In addition, the silicon diffused into the III-V substrate is simultaneously activated by the thermal oxidation process. Moreover, a small amount of $O_2$ from the oxidation atmosphere diffuses into the Si layer, which may combine with silicon at the surface to form a very thin top layer of silicon dioxide. The thermal oxidation of the silicon layer results in increased electrical activation of the diffused Si and reduced sheet resistance for shallow doping regions. The sheet resistance and the depth of the silicon diffusion is controlled by the thickness of the silicon layer and the oxidation conditions. The thermal oxidation may be performed in situ with the silicon deposition thereby greatly simplifying the manufacturing process. Thus, for the first time, silicon diffusion into a III-V compound substrate can be achieved by a well controlled process without depositing a $SiO_2$ cap layer as was taught by the prior art.

In another embodiment of the method of the invention, a subsequent step of annealing the silicon capped III-V semiconductor substrate is employed to further activate the diffused silicon. The annealing step causes the resistivity of the doping region to decrease in value by a factor of 2 or more from that obtained from the thermal oxidizing step. In this embodiment, a silicon doped region of gallium arsenide has a sheet resistance of about 25 ohms per square or greater and an electron doping concentration in the range of about $1 \times 10^{18}$ to $1 \times 10^{19}$ $cm^{-3}$ for shallow diffusion depths of about 0.2 $\mu m$ or less.

The method of the present invention may be used to fabricate a semiconductor device on a III-V compound substrate with at least one silicon doped region having a sheet resistance less than 50 ohms per square and an electron doping concentration greater than $6 \times 10^{18}$ $cm^{-3}$ for depths of about 0.2 $\mu m$ or less. For example, a MESFET having a gallium arsenide substrate with source and drain regions separated by a channel region all being n-doped by the inventive silicon diffusion process may be formed. Self-aligned source and drain regions can be easily fabricated by depositing the MESFET gates prior to the silicon diffusion process. Contacts to the source and drain regions may be formed by chemically cleaning the silicon layer and depositing a metal on the silicon, followed by a low temperature anneal which will provide a low resistivity contact to the underlying silicon doped regions.

The silicon diffusion process of the present invention avoids the damage caused by ion implantation and provides a simple yet powerful method to achieve shallow n-doping in III-V compounds in a controlled manner. The deposition of a $SiO_2$ cap layer is no longer a necessity. Furthermore, the thickness of the Si is not limited to 100-200 angstroms as in the prior art but can be greater than 2,000 angstroms.

DETAILED DESCRIPTION OF THE INVENTION

Figure 1A:
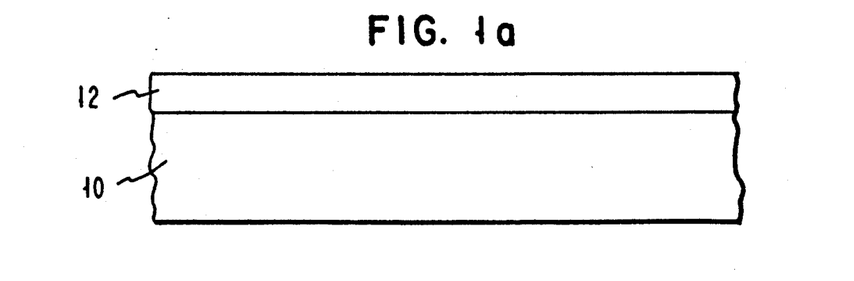
FIGS. 1a and 1b-1d are cross-sectional views showing steps for fabricating the silicon doped regions in accordance with the method of the present invention.
Figure 1B:
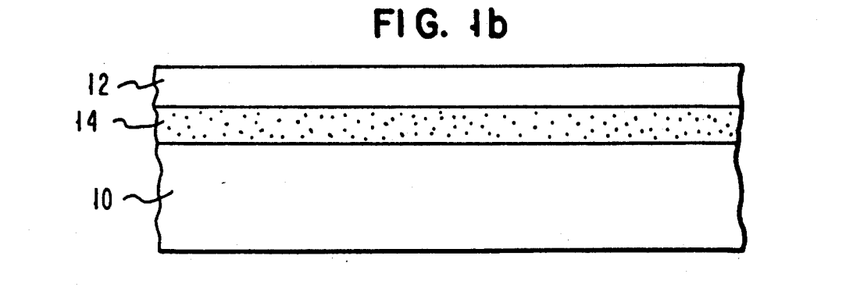

The present invention, is directed to a method for silicon doping a semiconductor substrate of a group III-V compound such as gallium arsenide. In accordance with the method of the invention, a gallium arsenide substrate is loaded into a deposition chamber and a layer of silicon is deposited onto the substrate. FIG. 1a shows the resulting structure of a III-V semiconductor compound substrate 10, capped with a layer of silicon 12. The deposition of the silicon layer may be formed by any suitable method such as molecular beam epitaxy, chemical vapor deposition e-beam evaporation or sputtering. The thickness of the silicon cap layer is one of the factors that is used to control the depth of the silicon diffusion. Depending on the desired result, the silicon layer can be deposited from a thickness of about 100 angstroms to 2000 angstroms or greater.

After the deposition of the silicon layer 12, the silicon cap layer is thermally oxidized at a temperature in the range of about 500° to 1100° C. The thermal oxidation of the silicon causes silicon to diffuse into the substrate 10 to form diffusion region 14. The thermal oxidation step induces silicon diffusion into the underlying III-V substrate and simultaneously promotes the electrical activation of the diffused silicon. During the process, gallium and arsenic out diffuse into the silicon cap layer in an amount equal to or greater than the amount of silicon diffusing into the gallium arsenide. In addition, a small amount of $O_2$ diffuses into the silicon layer. The diffusion of oxygen into the silicon cap layer may cause a very thin layer (on the order of a few monolayers) of silicon dioxide (not shown) to form on the surface of the cap layer 12. The inventors have determined that the $SiO_2$ layer that may form is not critical to the diffusion of silicon in the inventive method. Therefore, in contrast to the prior art teachings, the method of the present invention does not require that the silicon layer be capped with $SiO_2$ for silicon diffusion to occur.

Figure 1C:
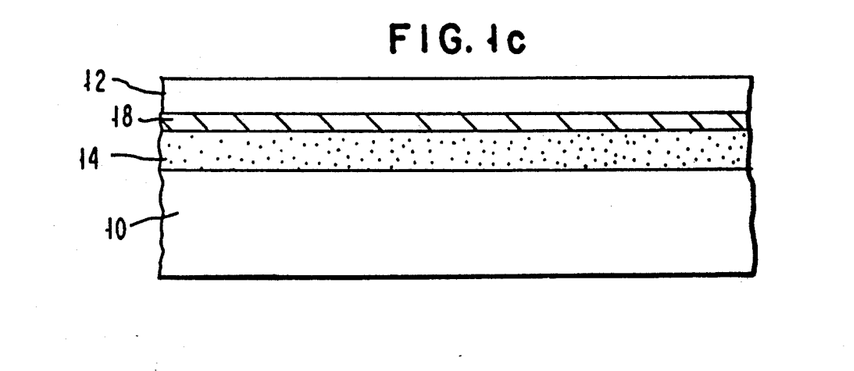
Figure 1D:
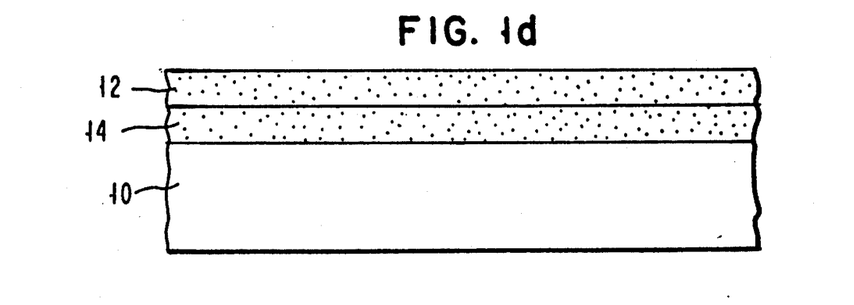

FIG. 1d, phosphorus, arsenic or boron doping is added to the deposited silicon prior to oxidation. The dopant, typically at high concentrations, will enhance the rate of silicon doping of the substrate that is achieved by the subsequent thermal oxidation step.

The thermal oxidation may be performed by a conventional furnace process or by a rapid thermal oxidation (RTO) process. The difference between the furnace and RTO processes is that the furnace process is limited to a temperature of 850° or less, while in the RTO process, temperatures of 1000° C. or greater can be achieved. The oxidizing ambient may be pure oxygen, dry air, steam, or a diluted oxidation ambient. The diluted oxidation ambient may be from 200 ppm oxygen mixed with argon or greater. The rapid thermal oxidation process in a diluted oxidation ambient may be more desirable than the pure $O_2$ oxidation for certain applications as the diluted RTO process minimizes undesirable oxidation of any uncapped surface areas of the substrate as well as various metals and silicides on the substrate during the doping process.

In the subsequent annealing step, the thermally oxidized sample is subjected to an annealing treatment at temperatures of about 600° to 1100° C. in an inert ambient. The subsequently annealing step may be performed in situ, with the thermal oxidation step. The annealing treatment further activates the silicon diffused within the III-V compound and causes the resistivity of the diffused region to decrease from the value obtained when the silicon was driven by the thermal oxidation step. The sheet resistance and depth of diffusion can be further controlled by controlling the annealing conditions, in addition to controlling the silicon thickness and the oxidation conditions.

EXAMPLE I

A gallium arsenide substrate was placed in a reaction chamber and a layer of silicon was deposited by e-beam evaporation. Two samples were made, one with a silicon cap layer of 500 angstroms thick and a second with a silicon cap layer of 1600 angstroms thick. Subsequently, the samples were oxidized by a conventional furnace oxidation technique to diffuse silicon into the gallium arsenide. For the sample with the 500 angstrom silicon cap layer, the oxidation was performed at 800° C. for 25 minutes. The oxidation for the sample with the 1600 angstrom silicon cap layer was at 825° C. for 15 minutes. Table I below shows the electrical data obtained from the two samples.

TABLE I

| | | | Furnace Oxidation Electrical Data Oxygen Ambient: 100% Dry $O_2$ | | | |
|---|---|---|---|---|---|---|
| Si Cap (Å) | Sample | Oxidat. Condit. °C./min. | Sheet Resistance (Rs) (ohm/sq) | Sheet Carriers (Ns) ($cm^{-2}$) | Hall Mobility ($\mu$) ($cm^2$/volt-sec) | Depth (Å) at ($1 \times 10^{17}$ $cm^{-3}$) of Si |
| 500 | (a) | 800/25 | 155 | $3.5 \times 10^{13}$ | 1150 | 2000 |
| 1600 | (b) | 825/15 | 290 | $2.6 \times 10^{13}$ | 825 | 2700 |

Figure 2:
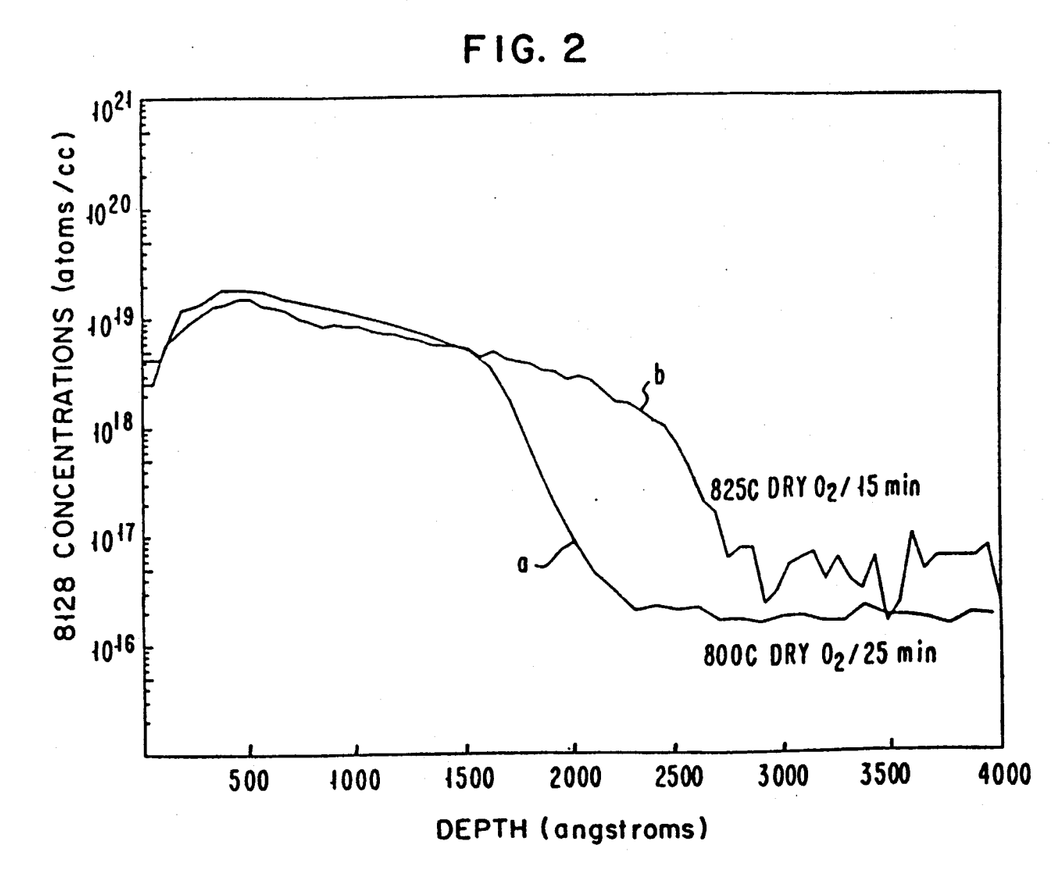
FIG. 2 is a set of curves of the Si atomic concentration versus the Si diffusion depth for furnace thermal oxidation.

An alternate embodiment is shown in FIG. 1c in which a diffusion barrier layer 18 of silicon nitride or aluminum oxide is interposed between the substrate 10 and the silicon layer 12 prior to the thermal oxidation. The barrier layer 18 will typically be in the range of about 100 to 200 angstroms. The barrier layer 18 acts to prevent the out diffusion of gallium, arsenic or other group III and V elements into the silicon layer during the thermal oxidation step. In a further option, shown in FIG. 2 shows the atomic silicon concentration versus the depth of the diffused silicon for samples a and b obtained by secondary ion mass spectrometry (SIMS). As can be seen from FIG. 2, the silicon atomic concentration within 0.2 $\mu$m was in the range of about $1 \times 10^{17}$ $cm^{-3}$ to over $1 \times 10^{19}$ $cm^{-3}$ for sample a. The atomic concentration within 0.2 $\mu$m for sample b was in the range of about $5 \times 10^{18}$ $cm^{-3}$ to over $1 \times 10^{19}$ $cm^{-3}$. As can be seen from Table I, for shallow diffusion regions of about 2,000 angstroms in sample a, the sheet resistance was less than 200 ohms per square.

EXAMPLE II

A silicon cap layer was deposited on a gallium arsenide substrate in the same manner as in Example I. The silicon cap layer was then subjected to rapid thermal oxidation (RTO) procedure to cause silicon to diffuse into the gallium arsenide. Three samples were made having a silicon cap thickness of 500 angstroms and one sample was made having a silicon cap thickness of 1600 angstroms. Each sample was oxidized in a dilute oxygen ambient of 1000 ppm $O_2$ in Argon. The samples were each then subjected to a subsequent anneal by a rapid thermal annealing (RTA) technique.

Figure 3:
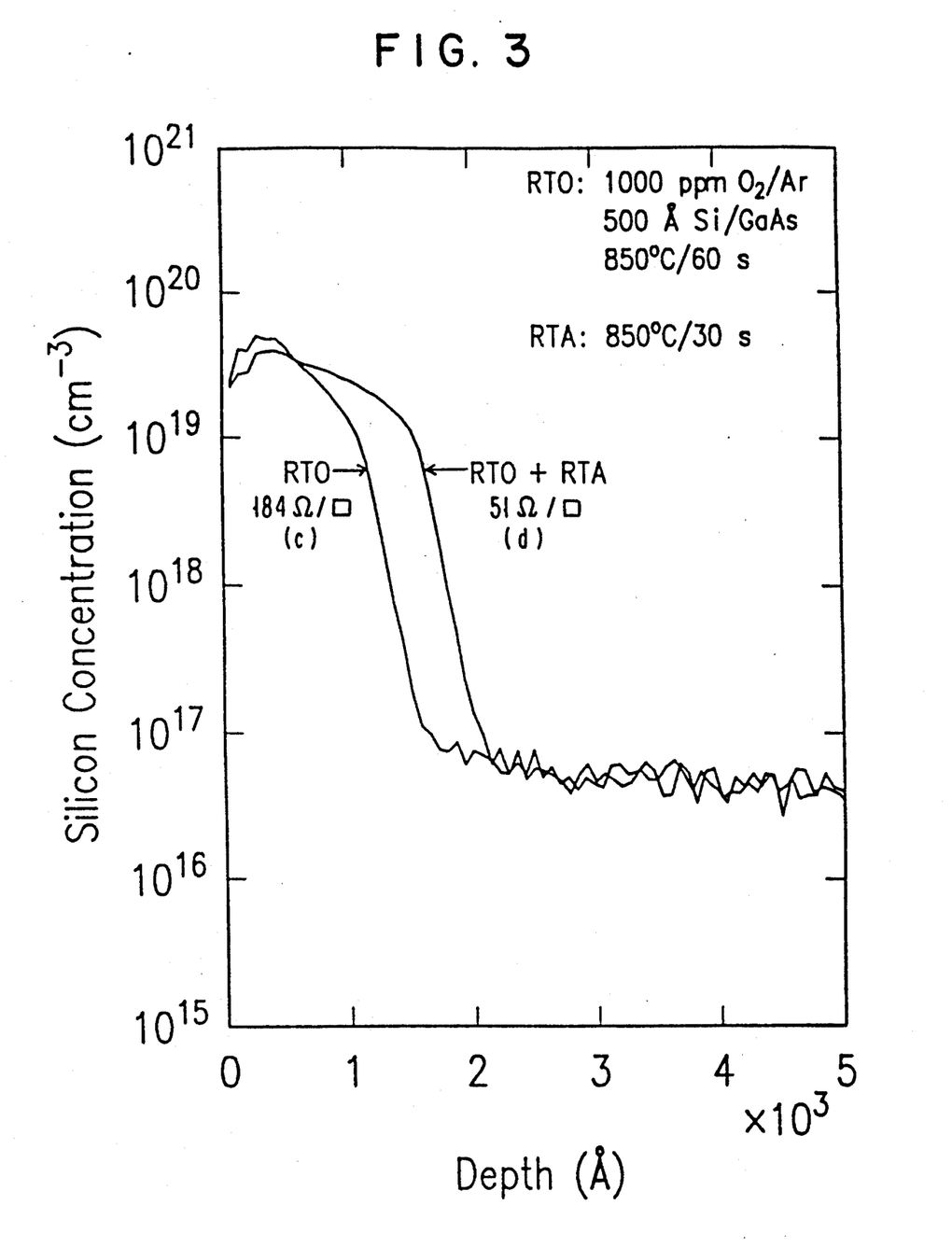
FIG. 3 is a set of curves of the Si atomic concentration versus the Si diffusion depth for the oxidation, and oxidation plus the subsequent annealing in accordance with another embodiment of the method of the present invention.

FIG. 3 shows the SIMS profiles for a sample that was first subjected to an RTO and subsequently subjected to an RTA. Curve c is for the RTO at 850° C. for 60 seconds and curve d is after a subsequent annealing was performed by RTA at 850° C. for 30 seconds. Table II below shows the electrical data at various silicon cap thickness's, and temperatures and time periods.

TABLE II

| | Two-Step Annealing (RTO and RTA) Electrical Data Oxygen Ambient: 1000 ppm in Ar | | | | | |
|---|---|---|---|---|---|---|
| Cap (Å) | RTO (°C./sec) | RTA (C./sec) | Rs (ohm/sq) | Ns (cm−2) | u (cm2/v-sec) | Depth $(1 \times 10^{17}$ cm$^{-3})$ of Si |
| 500 | 850/60 | — | 184 | $3.0 \times 10^{13}$ | 1120 | 1800 |
| | 850/60 | 850/30 | 51 | $1.1 \times 10^{14}$ | 1145 | 2200 |
| | 1000/10 | — | 102 | $8.0 \times 10^{13}$ | 763 | 3250 |
| | 1000/10 | 950/5 | 37 | $2.4 \times 10^{14}$ | 715 | 3500 |
| | 1000/20 | — | 66 | $1.3 \times 10^{14}$ | 743 | 6000 |
| | 1000/20 | 950/5 | 30 | $3.3 \times 10^{14}$ | 630 | 6000 |
| 1600 | 850/60s | — | 242 | $2.0 \times 10^{13}$ | 1263 | 1600 |
| | 850/60s | 850/30s | 93 | $5.0 \times 10^{13}$ | 1350 | 2000 |

As can be seen from the first line of data in Table II, the RTO run produced a silicon doped region of 1800 angstroms thick with a sheet resistance of 184 ohms per square, while the subsequent RTA produced a depth of 2200 angstroms with a sheet resistance of 51 ohms per square. Thus, a pronounced reduction in sheet resistance was obtained by the additional annealing treatment. The data shows that sheet resistances can be obtained, depending on the thickness of the silicon cap layer, as low as about 30 ohms per square or greater. As can be seen from FIG. 3, the atomic concentration of silicon was between $1 \times 10^{17}$ cm$^{-3}$ to $5 \times 10^{19}$ cm$^{-3}$ within 0.22 μm even after the subsequent annealing step. In addition, the doping efficiency increased dramatically by a factor of about 2 to up to 3.5 by subjecting the substrate to the subsequent annealing step. Thus, in accordance with the embodiment of the invention which includes a thermal oxidation and subsequent annealing, a silicon doped region in gallium arsenide can be obtained having a resistivity of about 50 ohms per square or less and a doping concentration of about $10^{19}$ cm$^{-3}$, values that heretofore could not be obtained by known prior art approaches.

The oxidation conditions are also a major factor that determines the depth of silicon diffusion. The oxidation conditions include the type of oxygen ambient, the amount of oxygen therein, the temperature and the length of time the process runs. By controlling the thickness of the silicon layer and the oxidation conditions, the sheet resistance and depth of diffusion can be controlled. Depending on the thickness of the deposited silicon, and the oxidation conditions, the present invention provides for silicon diffusion regions into the III-V substrate to a thickness in the range of about 100 to 2000 angstroms or greater.

Figure 4:
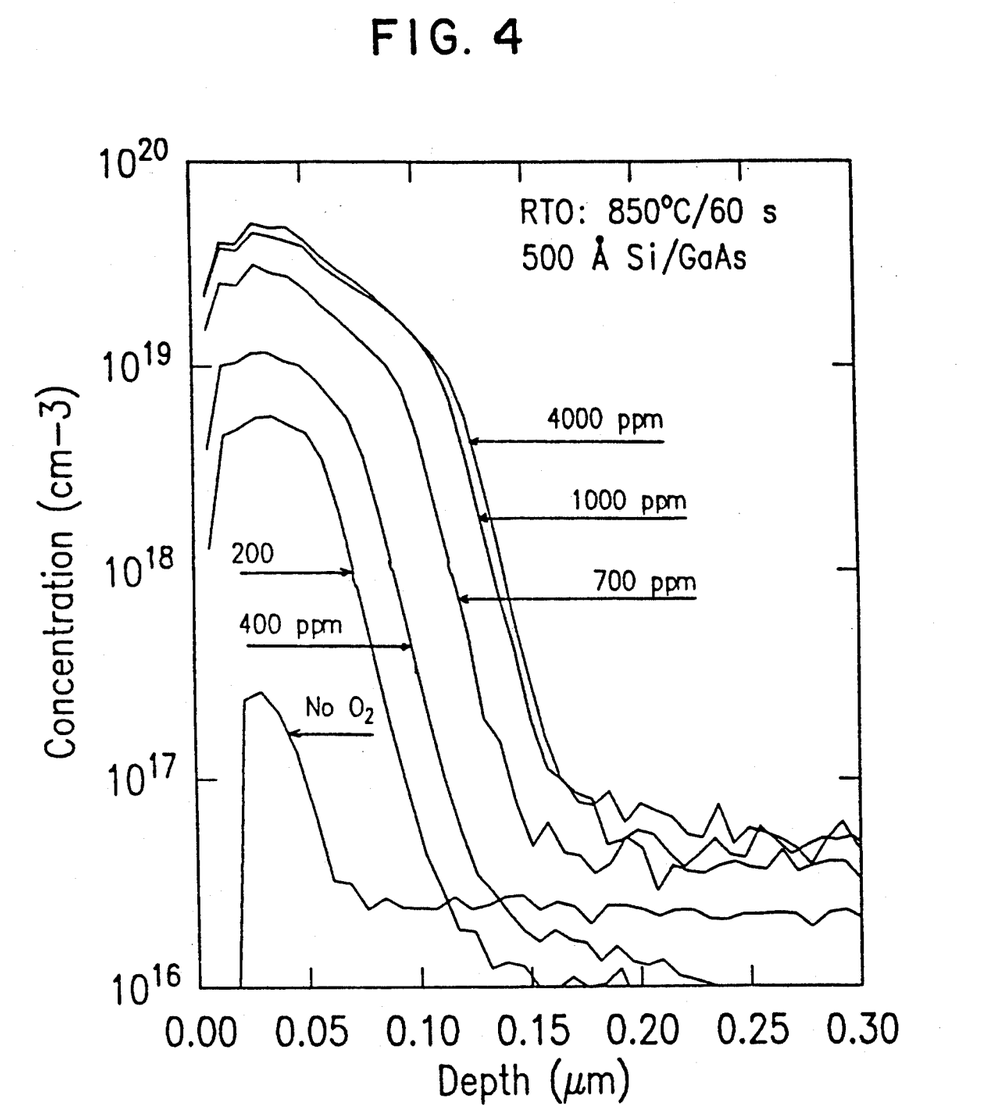
FIG. 4 is a set of curves of the Si atomic concentration versus the Si diffusion depth illustrating control of Si diffusion depth as well its concentration by varying the oxygen content in the RTO ambient.
Figure 5:
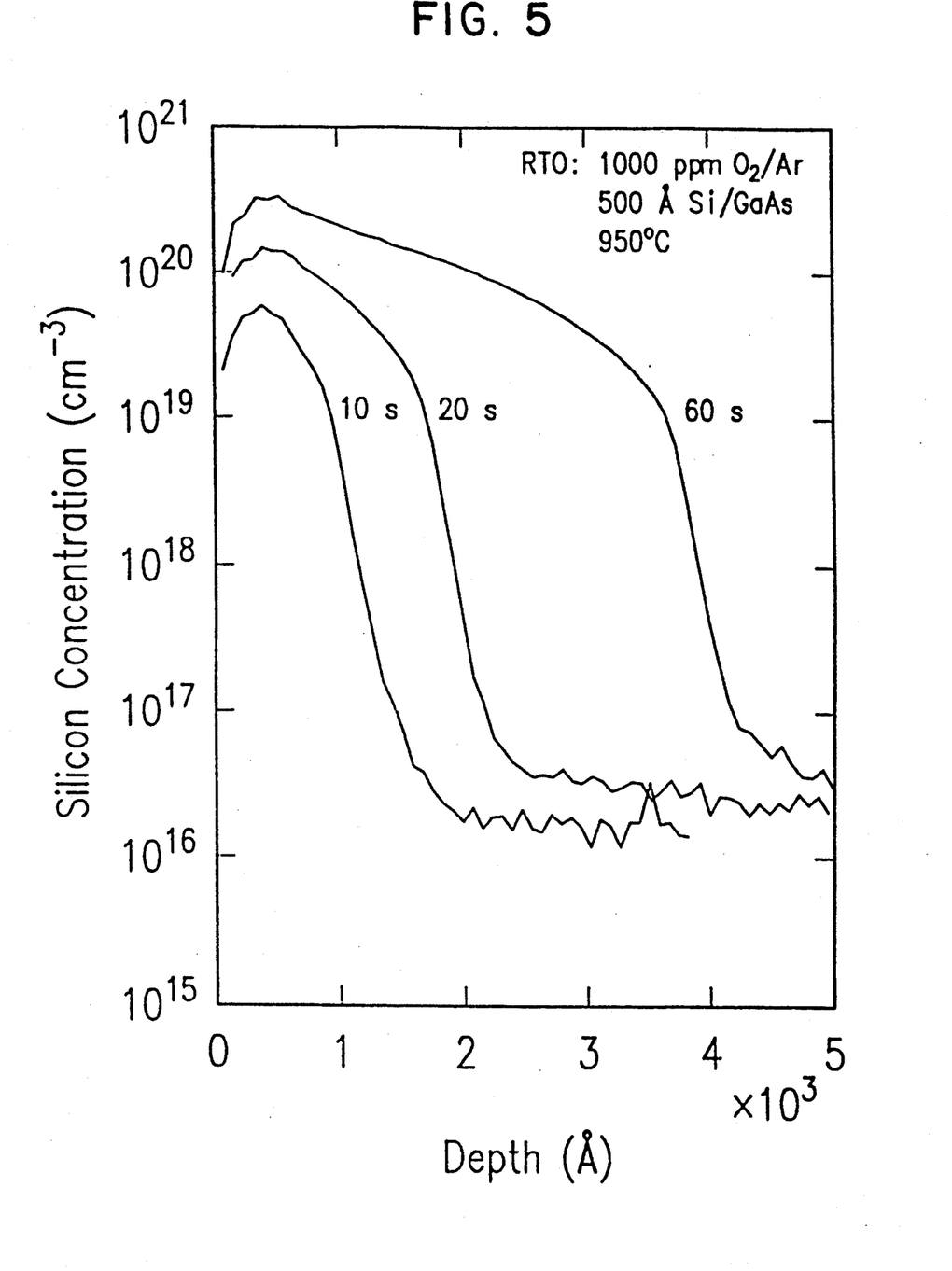
FIG. 5 is a set of curves of the Si atomic concentration versus the Si diffusion depth illustrating control of Si diffusion depth as well concentration by varying the diffusion time at 950° C. for a Si cap of 500 A and oxygen content of 1000 ppm during RTO.
Figure 6:
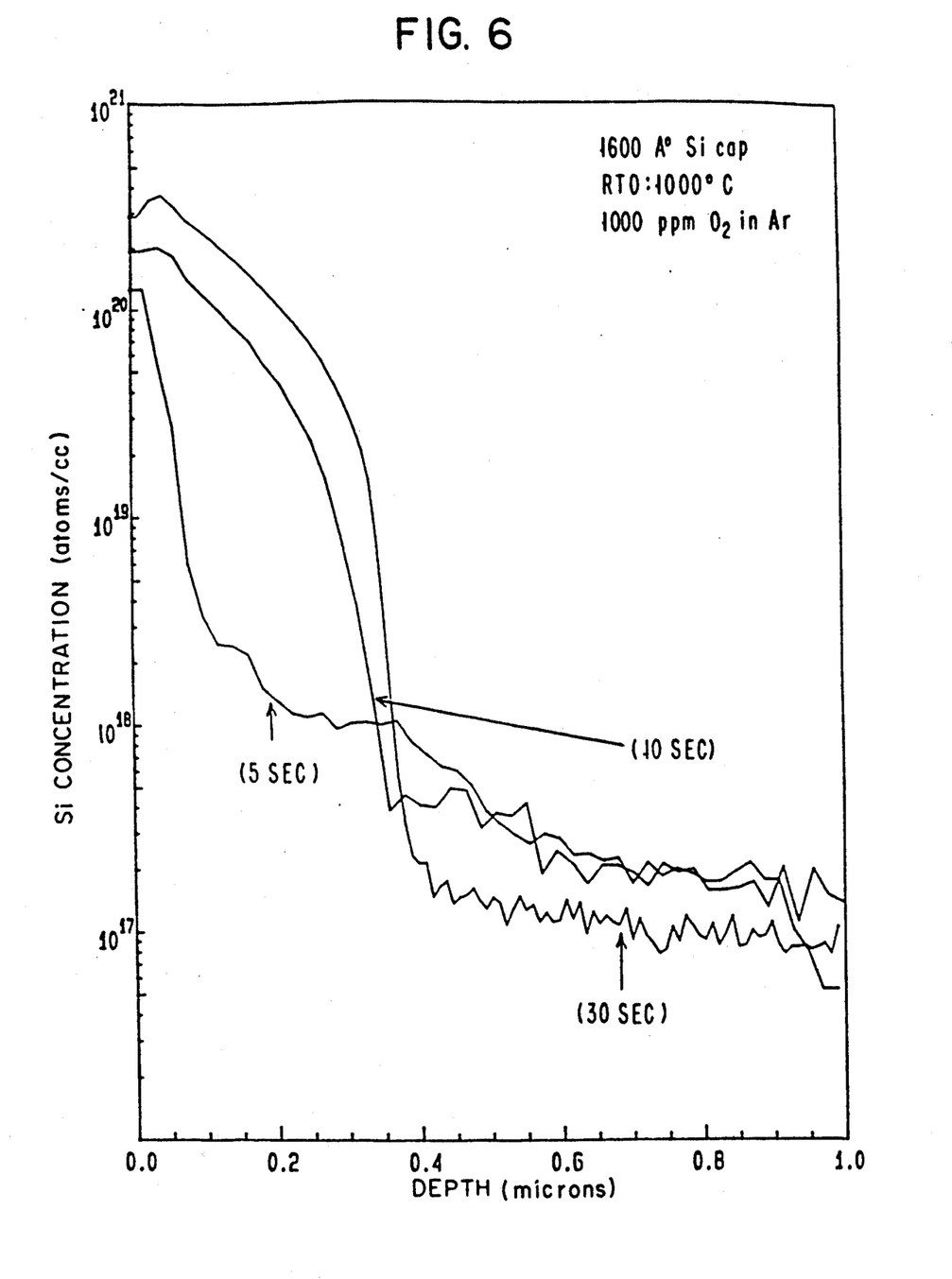
FIG. 6 is a set of curves of the Si atomic concentration versus the Si diffusion depth illustrating control of Si diffusion depth as well concentration by varying the diffusion time at 1000° C. for a Si cap of 1600 A and oxygen content of 1000 ppm during RTO.

FIGS. 4, 5 and 6 are atomic silicon concentration versus silicon diffusion depth curves that illustrate the type of control that may be accomplished with the inventive silicon doping method. FIG. 4 is a set of atomic Si concentration versus diffusion depth curves illustrating control of Si diffusion depth as well its concentration by varying the oxygen content in the RTO ambient. All RTOs were performed at 850° C. for 60 seconds with a 500 A thick Si cap. The curves show the difference in concentration and depth for an RTO step having varied oxygen concentration of 200 ppm, 400 ppm, 700 ppm, 1000 ppm and 4000 ppm. A curve is also shown for an anneal of the silicon capped substrate without oxygen, which resulted in no significant silicon doping. As can be seen, at a silicon concentration of about $10^{18}$ cm$^{-3}$, the depth of silicon diffusion increased from about 750 angstroms at 200 ppm $O_2$ to about 1400 angstroms at 4000 ppm $O_2$. Similarly, at a silicon depth of about 1000 angstroms, the silicon concentration increased from about $7 \times 10^{17}$ cm$^{-3}$ at 200 ppm $O_2$, to about $2 \times 10^{19}$ cm$^{-3}$ at 4000 ppm $O_2$.

FIG. 5 is a set of atomic Si concentration versus diffusion depth curves illustrating control of Si diffusion depth as well concentration by varying the diffusion time at 950° C. for a Si cap of 500 angstroms and oxygen content of 1000 ppm during RTO. The time was varied at 10, 20 and 60 seconds. FIG. 6 is a set of atomic Si concentration versus diffusion depth curves illustrating control of Si diffusion depth as well concentration by varying the diffusion time at 1000° C. for a Si cap of 1600 angstroms and oxygen content of 1000 ppm during RTO. The time was varied at 5, 10 and 30 seconds. As can be seen from FIGS. 4, 5 and 6, the present invention provides a wide range of control of the depth and concentration of the silicon doping of III-V compounds.

The method of the present invention for silicon doping of III-V compounds may be useful in the fabrication of various semiconductor devices. One of the more common devices using III-V materials is the metal semiconductor field effect transistor (MESFET). The silicon doping methods described herein may be used to form the channel region of a MESFET where the source and drain regions are formed by other known techniques such as ion implantation. Alternately, the methods of the invention may be used to form the source and drain regions with the channel being formed by other known techniques. Finally, all three regions, the source, drain and channel may be formed using the inventive methods. In addition, the silicon doping process may be used to form enhancement mode or depletion mode devices.

Figure 7A:
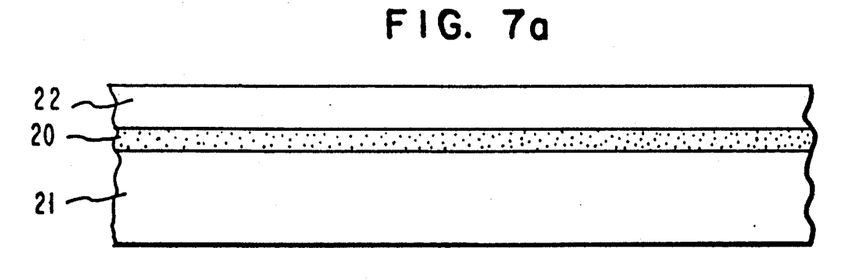
FIGS. 7a–7d show the steps of fabrication of a MESFET in accordance with the method of the present invention.
Figure 7B:
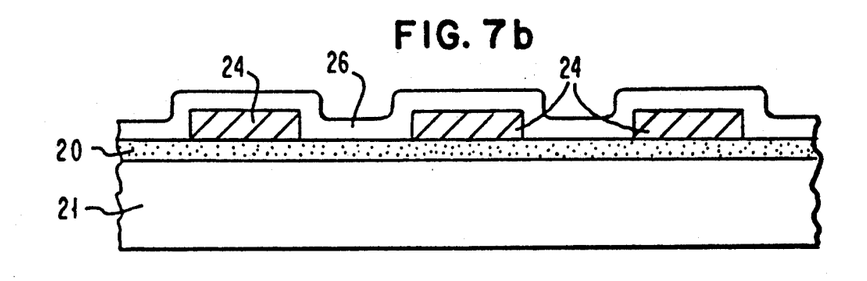

Turning now to FIGS. 7a-7d, there is shown a method for forming a MESFET in which the processes of the present invention are used to form the source, drain and channel regions. In a first step, as shown in FIG. 7a, a very shallow diffusion layer 20 is formed in a III-V substrate 21 in accordance with the methods of the present invention described above. Portions of the layer 20 will act as the channel region for the MESFET. The silicon capping layer 22 is then removed by reactive ion etching and metal gates 24, as shown in FIG. 7b, are then deposited using conventional photolithographic or selective deposition techniques. The gates may be any suitable material such as a refractory metal and they may be formed with or without insulating sidewalls. A conformal layer of silicon 26 is then deposited on the substrate 22 and gates 24. Depending on the gate material, a thin layer of $SiO_2$ or other dielectric may be required between the gate and Si cap to prevent any undesirable reaction between the cap and the gate during RTO.

Figure 7C:
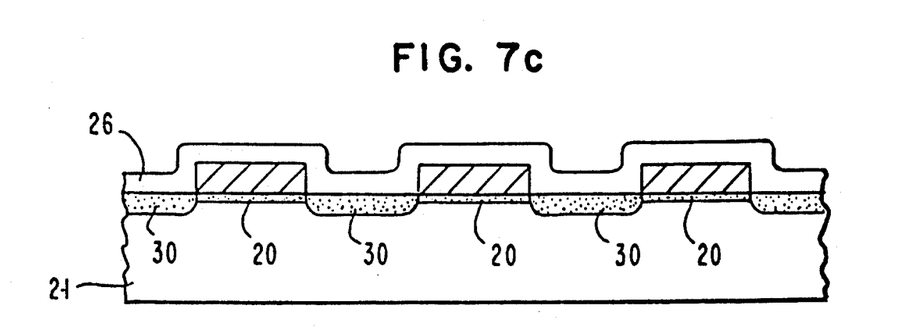
Figure 7D:
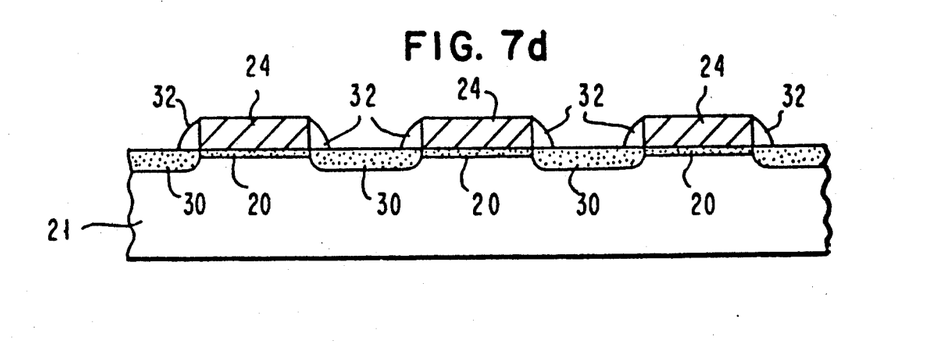

Thereafter, as shown in FIG. 7c, the wafer is subjected to a second thermal oxidation step in accordance with the present invention thereby forming silicon diffusion regions 30 in the substrate 21 in the areas between the gates 24. Subsequently, the silicon layer 26 is removed either chemically or by reactive ion etching, in the latter case silicon gate sidewalls 32, as shown in FIG. 7d are formed. Thus, self-aligned source and drain regions 30 are formed.

Ohmic contacts are then deposited on the source and drain regions 30 to complete the MESFET. In one embodiment, the ohmic contacts are formed before removal of the silicon cap layer. In this embodiment, the silicon layer above the gates 24 is selectively removed. A metal such as nickel, cobalt, titanium, or other suitable metal is deposited on the silicon between the gates. Thereafter, the silicon/metal bilayer is subjected to a low temperature anneal that provides a low resistivity contact to the underlying source and drain regions. This method of forming the ohmic contacts will be enhanced where the silicon is doped with arsenic or phosphorus prior to oxidation.

Figure 8A:
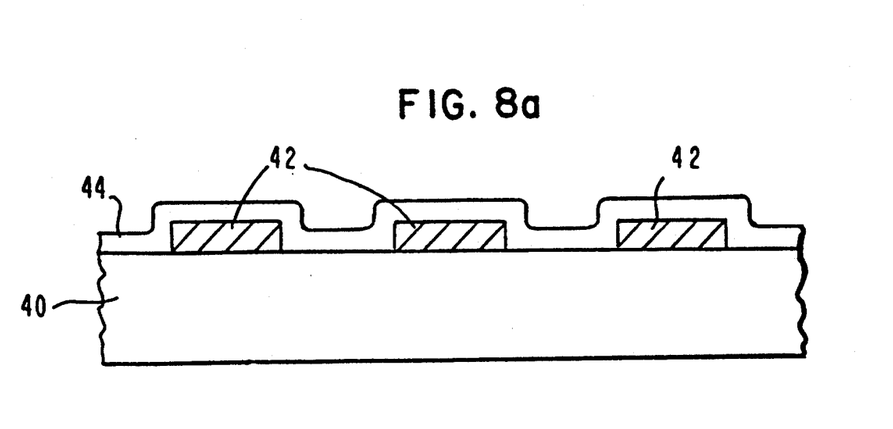
FIGS. 8a–8c show the steps of fabrication of a semiconductor device in accordance with another embodiment of the present invention.
Figure 8B:
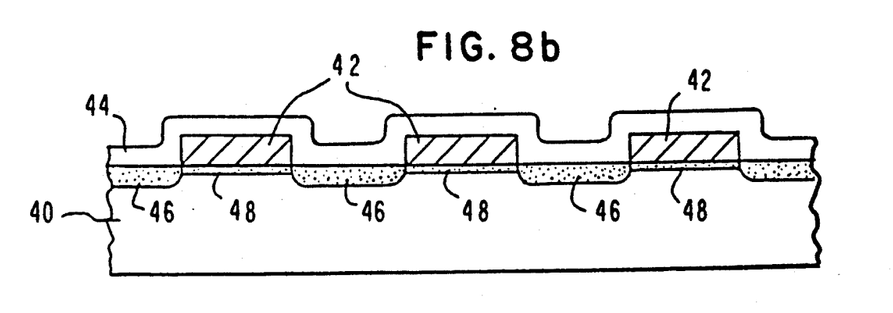
Figure 8C:
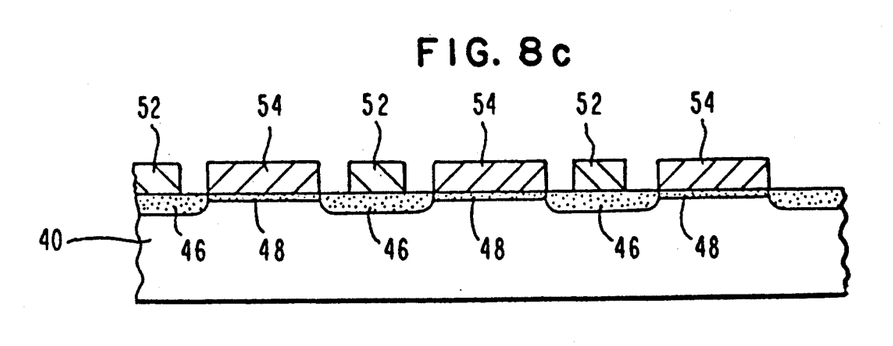

In an alternative embodiment, the source, drain and channel regions are diffused in a single oxidation step. Referring to FIG. 8a, a substrate 40 of a III-V compound is provided and suitable dielectric pads 42, such as silicon oxinitride, are deposited on the substrate by conventional masking and etching techniques. The material forming the pads must not be a barrier to silicon diffusion but must reduce silicon diffusion through the material. A silicon layer 44 is then deposited on the substrate and the silicon oxinitride pads. Thereafter, the substrate is subjected to the thermal oxidation step which results in silicon diffusing into the substrate to form source and drain regions 46 and channel regions 48 as shown in FIG. 8b. The silicon above the pads 42 must diffuse through the pads thereby providing a very shallow channel region with respect to the source and drain regions that diffuse directly from the silicon. As shown in FIG. 5c, after the silicon layer 44 is removed, ohmic contacts 52 are formed to the source and drain regions 46 and gate regions 54 are formed by applying advanced photolithography techniques to provide tight alignment tolerances.

The present invention provides a simple yet powerful method to achieve controlled shallow silicon doping in III-V compounds by depositing a silicon cap layer on the III-V substrate followed by a thermal oxidation treatment. A subsequent annealing treatment enhances the electrical characteristics of the doped region. High electron concentration amounts in the range of $10^{19}$ $cm^{-3}$ and low resistivities the range of less than 50 ohms per square can be achieved for shallow regions of 2000 angstroms or less.

While the invention has been particularly shown and described with respect to the preferred embodiments thereof, it should be understood by those skilled in the art that the foregoing and other changes in form and detail may be made therein without departing from the spirit and scope of the invention which should be limited only by the scope of the appended claims.

We claim:

1. A method of fabricating a semiconductor device comprising the steps of:
   depositing a layer of silicon without a silicon dioxide cap layer on a surface of a semiconductor substrate of a III-V compound;
   thermally oxidizing said silicon layer thereby diffusing silicon into at least a portion of said substrate;
   said thermal oxidizing step being performed under oxidizing conditions including type of oxygen ambient, amount of oxygen in the ambient, temperature and time of said step, and no more than a few monolayers of silicon dioxide being formed on a top surface of said silicon layer during said thermal oxidizing step; and
   controlling the sheet resistance and depth of the diffused silicon by controlling the thickness of said silicon and one or more of said oxidizing conditions.

2. The method of claim 1 wherein said silicon depositing step and said thermal oxidizing step are performed in situ.

3. The method of claim 1 wherein said silicon is deposited to a thickness of about 100 angstroms or greater.

4. The method of claim 1, wherein said thermal oxidizing step is performed in an atmosphere of one of pure $O_2$, dry air, steam and diluted $O_2$ in an inert carrier gas.

5. The method of claim 4 wherein the oxidizing atmosphere is diluted $O_2$ in Ar having a oxygen concentration of about 200 ppm or greater.

6. The method of claim 1 wherein said thermal oxidizing step is performed at a temperature in the range of about 500° to 1100° C.

7. The method of claim 1 wherein said silicon is diffused into said substrate to a thickness of about 200 angstroms or greater.

8. The method of claim 1 wherein the oxidizing step is performed in a furnace at temperatures of 850° C. or less.

9. The method of claim 1 wherein the oxidizing step is performed by rapid thermal oxidation.

10. The method of claim 9 further including the step of annealing said substrate subsequent to said thermal oxidizing step sufficient to cause at least a portion of said substrate having the diffused silicon to have a sheet resistance lower than the sheet resistance of said portion after the thermal oxidizing step.

11. The method of claim 10 wherein said annealing step is performed by rapid thermal annealing.

12. The method of claim 10 wherein the depth of the silicon diffusing into at least a portion of said substrate is less than about one micron.

13. The method of claim 1 wherein the silicon is diffused with an electron concentration that can be varied up to about $1 \times 10^{19}$ cm$^{-3}$.

14. The method of claim 1, further including the step of depositing a barrier layer on said III-V compound substrate prior to the deposition of said silicon layer.

15. The method of claim 14 wherein said barrier layer is comprised on one of silicon nitride and aluminum oxide.

16. The method of claim 1 further including the step of doping said silicon layer prior to the thermal oxidizing step.

17. The method of claim 16 wherein the silicon layer is doped with one of phosphorus, arsenic and boron.

18. The method of claim 1 further including the step of forming an ohmic contact to the at least a portion of said substrate having the silicon diffusion by removing the oxide layer, depositing a layer of metal on the silicon layer and annealing the silicon and metal layers to provide a low resistivity contact to the portion of the substrate having the diffused silicon therein.

19. The method of claim 1 wherein the depth of the silicon diffusing into at least a portion of said substrate is less than about one micron.

20. The method of claim 1 wherein said sheet resistance of the diffused silicon is controlled by said thickness of the silicon.

21. The method of claim 1 wherein said layer of silicon is deposited on a surface of an initially undoped semiconductor substrate of a III-V compound.

22. The method of claim 1 further including the step of annealing said substrate subsequent to said thermal oxidizing step sufficient to cause at least a portion of said substrate having the diffused silicon to have a sheet resistance lower than the sheet resistance of said portion after the thermal oxidizing step.

23. The method of claim 22 wherein the sheet resistance of said at least a portion of said substrate having the diffused silicon less than 50 ohms/square.

24. The method of claim 22 wherein said annealing step is performed by rapid thermal annealing.

25. The method of claim 24 wherein said annealing step is performed in an inert atmosphere at a temperature of about 600° C. or greater.

26. The method of claim 22 wherein said thermal oxidation step and said annealing step are performed in situ.

27. The method of claim 22 wherein said silicon depositing step, said thermal oxidizing step and said annealing step are performed in situ.

28. The method of claim 22 wherein said silicon is deposited to a thickness of about 100 angstroms or greater.

29. The method of claim 22 wherein said thermal oxidizing step is performed in an atmosphere of one of pure $O_2$, dry air, steam and diluted $O_2$ in an inert carrier gas.

30. The method of claim 29 wherein said thermal oxidizing step is performed at a temperature in the range of about 500° to 1100° C.

31. The method of claim 30 wherein said silicon is diffused into said substrate to a thickness of about 200 angstroms or greater.

32. The method of claim 22 wherein at least a portion of said substrate having the diffused silicon has a sheet resistance of about 25 ohms/square or less.

33. The method of claim 12 wherein the silicon is diffused with an electron concentration of about $1 \times 10^{19}$ cm$^{-3}$.

34. The method of claim 22 wherein said thermal oxidizing step is performed under oxidizing conditions including type of oxygen ambient, amount of oxygen in the ambient, temperature and time of said step and wherein said annealing step is performed under annealing conditions including type of ambient, temperature and time and further including the step of controlling the sheet resistance and depth of the diffused silicon by controlling the thickness of said silicon, the oxidizing conditions and the annealing conditions.

35. The method of claim 22 wherein the depth of silicon diffusing into at least a portion of said substrate is less than about one micron.

36. A method of fabricating a semiconductor device comprising the steps of:
depositing a layer of silicon without a silicon dioxide cap layer on a surface of a semiconductor substrate of a III-V compound;
thermally oxidizing said silicon layer thereby diffusing silicon into at least a portion of said substrate;
said thermal oxidizing step being performed in a furnace under oxidizing conditions including type of oxygen ambient, amount of oxygen in the ambient, at a temperature of about 825° C. for a time of about 15 minutes; and
controlling the sheet resistance and depth of the diffused silicon by controlling the thickness of said silicon and one or more of said oxidizing conditions.

37. A method of fabricating a semiconductor device comprising the steps of:
depositing a layer of silicon without a silicon dioxide cap layer on a surface of a semiconductor substrate of a III-V compound;
thermally oxidizing said silicon layer thereby diffusing silicon into at least a portion of said substrate;
said thermal oxidizing step being performed in a furnace under oxidizing conditions including type of oxygen ambient, amount of oxygen in the ambient, at a temperature of about 800° C. for a time of about 25 minutes; and
controlling the sheet resistance and depth of the diffused silicon by controlling the thickness of said silicon and one or more of said oxidizing conditions.

38. A method of fabricating a semiconductor device comprising the steps of:
depositing a layer of silicon without a silicon dioxide cap layer on a surface of a semiconductor substrate of a III-V compound;
thermally oxidizing said silicon layer thereby diffusing silicon into at least a portion of said substrate;
said thermal oxidizing step being performed by rapid thermal oxidation under oxidizing conditions including type of oxygen ambient, amount of oxygen in the ambient, at a temperature of about 1,000° C. for a time of about 20 seconds; and
controlling the sheet resistance and depth of the diffused silicon by controlling the thickness of said silicon and one or more of said oxidizing conditions.

39. A method of fabricating a semiconductor device comprising the steps of:

depositing a layer of silicon without a silicon dioxide cap layer on a surface of a semiconductor substrate of a III-V compound;

thermally oxidizing said silicon layer thereby diffusing silicon into at least a portion of said substrate;

said thermal oxidizing step being performed by rapid thermal oxidation under oxidizing conditions including type of oxygen ambient, amount of oxygen in the ambient, at a temperature of about 850° C. for a time of about 60 seconds; and controlling the sheet resistance and depth of the diffused silicon by controlling the thickness of said silicon and one or more of said oxidizing conditions.

40. A method for forming a MESFET comprising the steps of:

depositing a first layer of silicon on a surface of a semiconductor substrate of a III-V compound;

thermally oxidizing said first silicon layer thereby diffusing silicon into at least a portion of said substrate at temperatures and oxidizing conditions to form a shallow channel diffusion region;

removing said silicon layer;

depositing at least one metal gate on the substrate;

depositing a second layer of silicon on the substrate and said at least one metal gate;

thermally oxidizing said second silicon layer thereby diffusing silicon into said substrate adjacent said at least one metal gate at temperatures and oxidizing conditions to form silicon diffusion source and drain regions; and removing said second silicon layer.

41. The method of claim 40 further including the step of forming ohmic contacts to said source and drain regions.

42. The method of claim 41 where said substrate is GaAs.

43. A method for forming a MESFET comprising the steps of:

depositing at least one pad of silicon oxinitride on the surface of a semiconductor substrate of a III-V compound;

depositing a conformal layer of silicon on the surface of said substrate and said pads;

thermally oxidizing said silicon layer thereby diffusing silicon into said substrate at temperatures and oxidizing conditions to form a channel region below said at least one pad and source and drain regions adjacent said pad;

removing said silicon layer and said at least one pad;

depositing a gate region on the substrate above said channel region; and forming ohmic contacts to said source and drain regions.

* * * * *

UNITED STATES PATENT AND TRADEMARK OFFICE
CERTIFICATE OF CORRECTION

PATENT NO. : 5,188,978
DATED      : February 23, 1993
INVENTOR(S) : Devendra K. Sadana, et al.

It is certified that error appears in the above-identified patent and that said Letters Patent is hereby corrected as shown below:

On the Title Page, Section [75]: "Joel deSouza" should read --Joel P. deSouza--

Column 9, line 8, Claim 15: "on" should read as --of--

Signed and Sealed this

Twenty-third Day of November, 1993

*Attest:*

BRUCE LEHMAN

*Attesting Officer*     *Commissioner of Patents and Trademarks*